(12) United States Patent
Aihara et al.

(10) Patent No.: US 10,747,106 B2
(45) Date of Patent: Aug. 18, 2020

(54) IMPRINT APPARATUS

(71) Applicant: CANON KABUSHIKI KAISHA, Tokyo (JP)

(72) Inventors: Sentaro Aihara, Utsunomiya (JP); Takehiko Ueno, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 944 days.

(21) Appl. No.: 14/962,006

(22) Filed: Dec. 8, 2015

(65) Prior Publication Data

US 2016/0158978 A1 Jun. 9, 2016

(30) Foreign Application Priority Data

Dec. 9, 2014 (JP) .................................. 2014-249197
Sep. 30, 2015 (JP) .................................. 2015-194405

(51) Int. Cl.
*G03F 7/00* (2006.01)
*B29C 59/02* (2006.01)
(Continued)

(52) U.S. Cl.
CPC ............ *G03F 7/0002* (2013.01); *B29C 59/02* (2013.01); *G03F 9/7038* (2013.01);
(Continued)

(58) Field of Classification Search
None
See application file for complete search history.

(56) References Cited

U.S. PATENT DOCUMENTS 8,734,701 B2 5/2014 Kawakami
2006/0032437 A1* 2/2006 McMackin ........... G03F 7/0002
118/100
(Continued)

FOREIGN PATENT DOCUMENTS

CN 101884019 A 11/2010
JP 2005353858 A 12/2005
(Continued)

OTHER PUBLICATIONS

Office Action issued in Korean Appln. No. 10-2015-0169819 dated Jan. 17, 2019.
(Continued)

*Primary Examiner* — Benjamin A Schiffman
(74) *Attorney, Agent, or Firm* — Rossi, Kimms & McDowell LLP

(57) ABSTRACT

The present invention provides an imprint apparatus that performs imprint processing of forming a pattern of an imprint material on a substrate using a mold, the apparatus including an image sensing unit configured to sense at least one of the mold and the substrate and obtain an image, and a determination unit configured to determine normality/abnormality of the imprint processing, wherein the imprint processing includes a first step of supplying the imprint material onto the substrate, and a second step of bringing the mold and the imprint material on the substrate into contact with each other, and the determination unit changes a reference of determination of the normality/abnormality of the imprint processing for each step of the imprint processing and determines the normality/abnormality of the imprint processing based on the image sensed by the image sensing unit.

23 Claims, 13 Drawing Sheets

(51) Int. Cl.
*G03F 9/00* (2006.01)
*B29C 43/58* (2006.01)
*B29K 105/00* (2006.01)

(52) U.S. Cl.
CPC ...... *G03F 9/7088* (2013.01); *B29C 2043/585* (2013.01); *B29C 2043/5891* (2013.01); *B29C 2059/023* (2013.01); *B29K 2105/0058* (2013.01)

(56) References Cited

U.S. PATENT DOCUMENTS

| | | | |
|---|---|---|---|
| 2006/0126058 A1* | 6/2006 | Nimmakayala | B82Y 10/00 356/139.04 |
| 2007/0018360 A1 | 1/2007 | Kolesnychenko et al. | |
| 2009/0140445 A1* | 6/2009 | Lu | B29C 43/003 264/40.1 |
| 2010/0101493 A1 | 4/2010 | Hodge et al. | |
| 2010/0314798 A1 | 12/2010 | Kawakami et al. | |
| 2011/0206852 A1* | 8/2011 | Shiode | B82Y 10/00 427/356 |
| 2012/0072003 A1 | 3/2012 | Matsuoka et al. | |
| 2015/0076724 A1* | 3/2015 | Sato | G03F 7/0002 264/40.1 |

FOREIGN PATENT DOCUMENTS

| | | |
|---|---|---|
| JP | 2009286067 A | 12/2009 |
| JP | 2010149469 A | 7/2010 |
| JP | 2011003616 A | 1/2011 |
| JP | 2011091235 A | 5/2011 |
| JP | 2011114309 A | 6/2011 |
| JP | 2011176132 A | 9/2011 |
| JP | 2012069701 A | 4/2012 |
| JP | 2012125942 A | 7/2012 |
| JP | 2013058517 A | 3/2013 |
| JP | 2014064022 A | 4/2014 |

OTHER PUBLICATIONS

Office Action issued in Taiwanese Appln. No. 104135429 dated Aug. 15, 2016. English translation provided.

Office Action issued in Japanese Appln. No. 2015-194405 dated Jun. 18, 2019.

Office Action issued in Chinese Appln. No. 201510885990.6 dated Apr. 3, 2019.

* cited by examiner

FIG. 2A
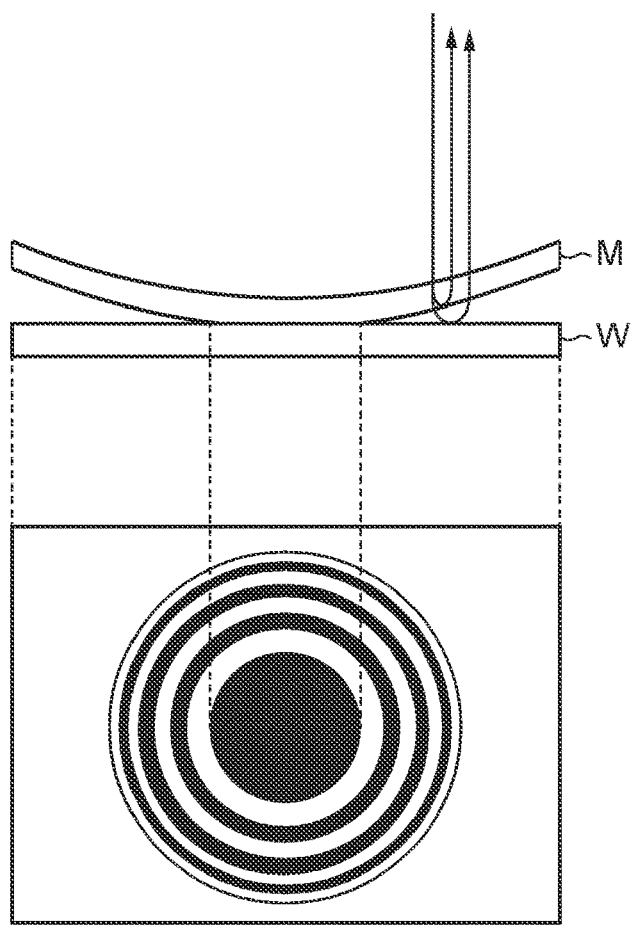
FIG. 2B
FIG. 3
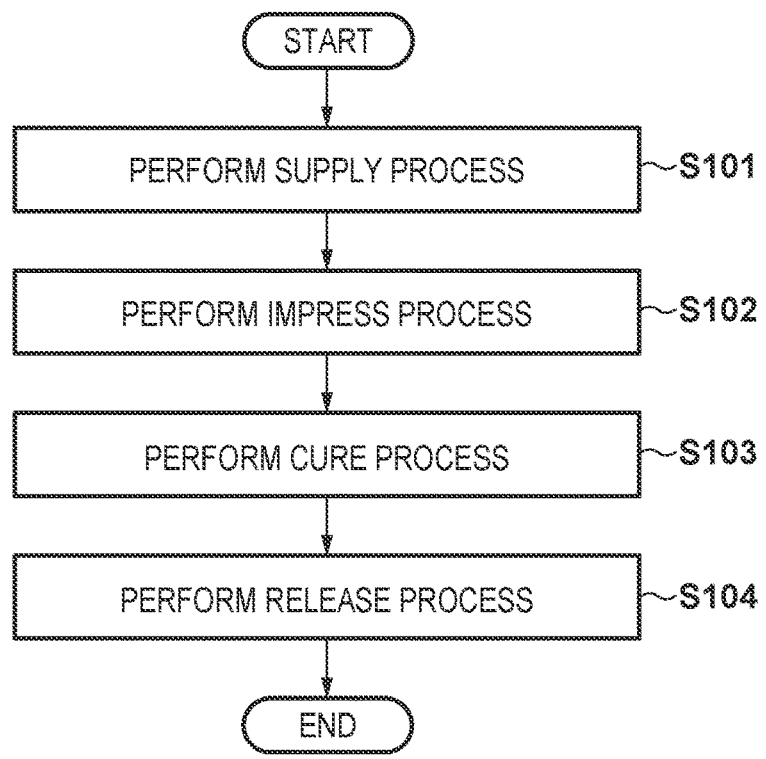

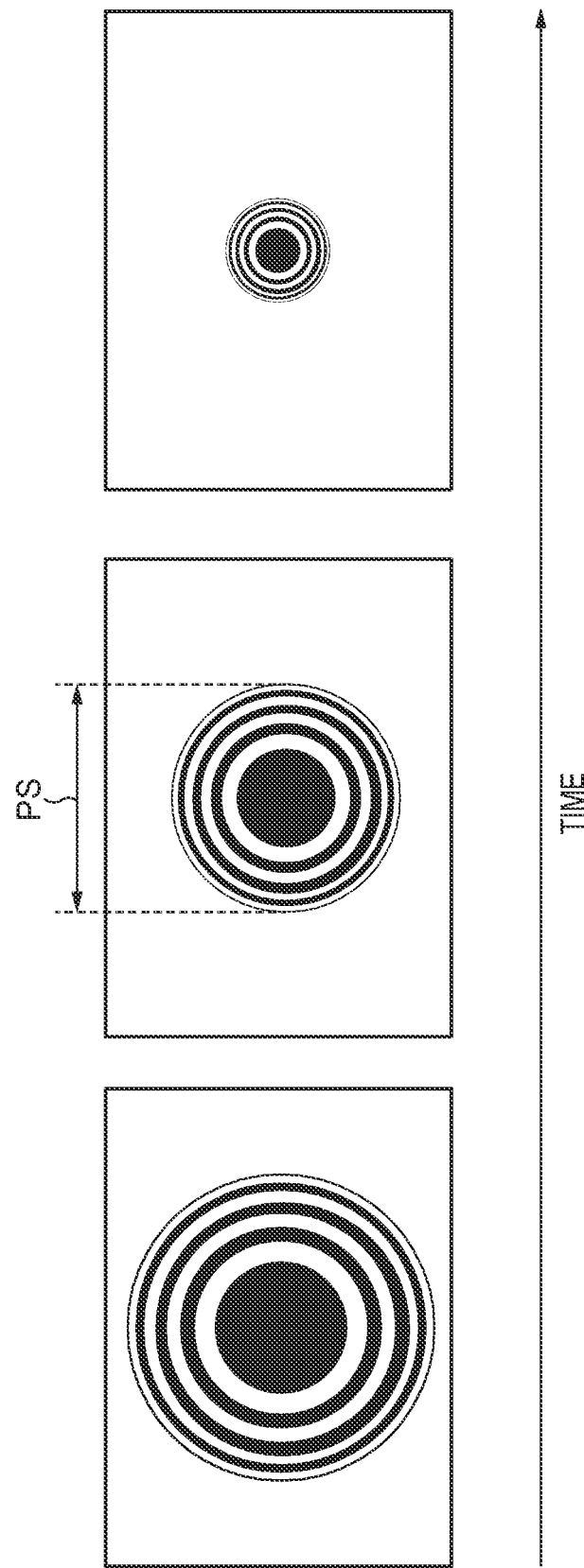

F I G. 13A
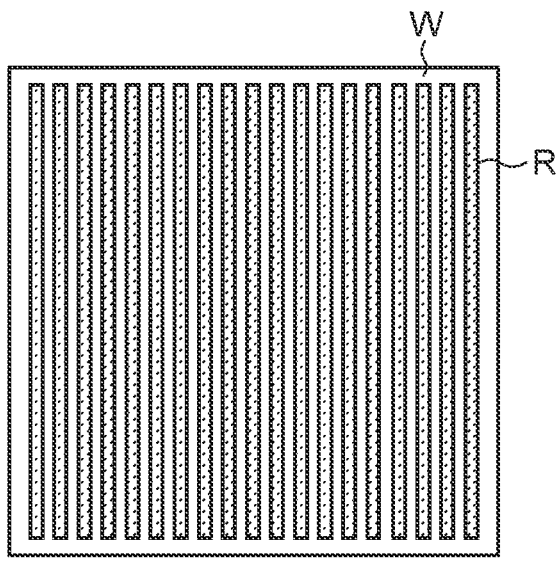
F I G. 13B
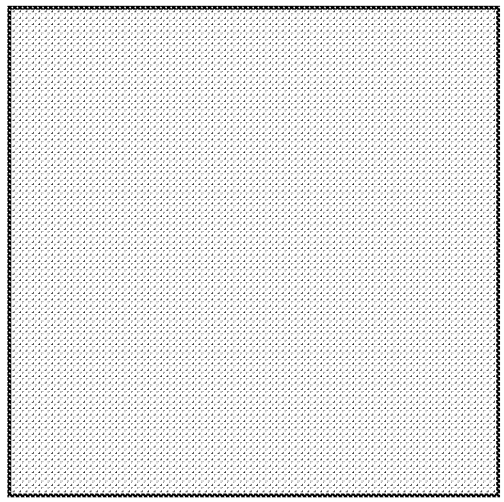
F I G. 13C
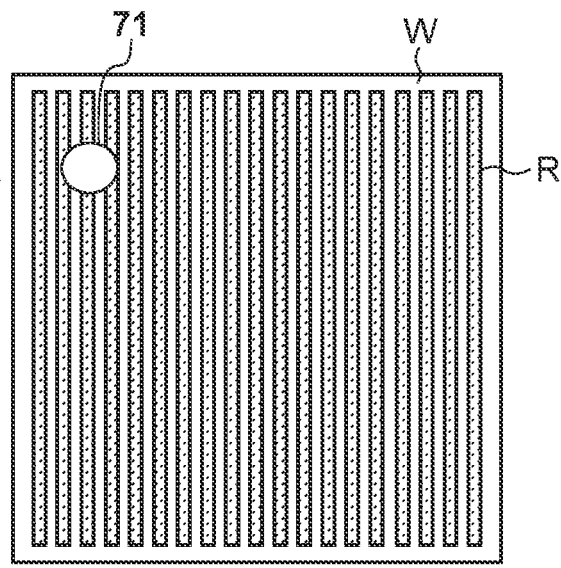
F I G. 13D
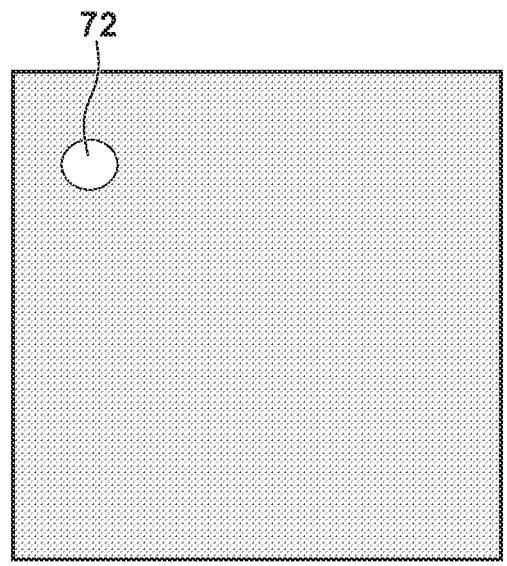

FIG. 15A
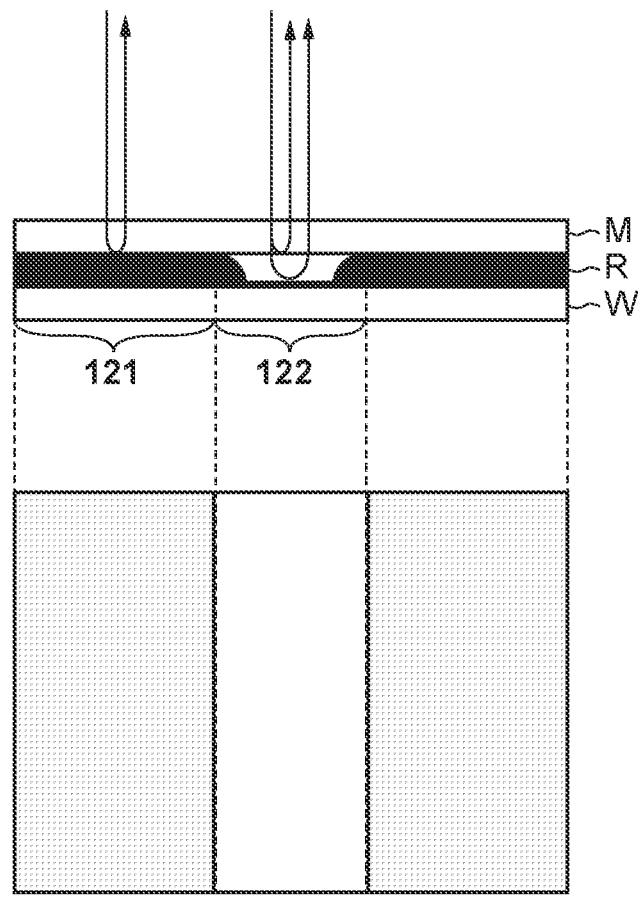
FIG. 15B
FIG. 16
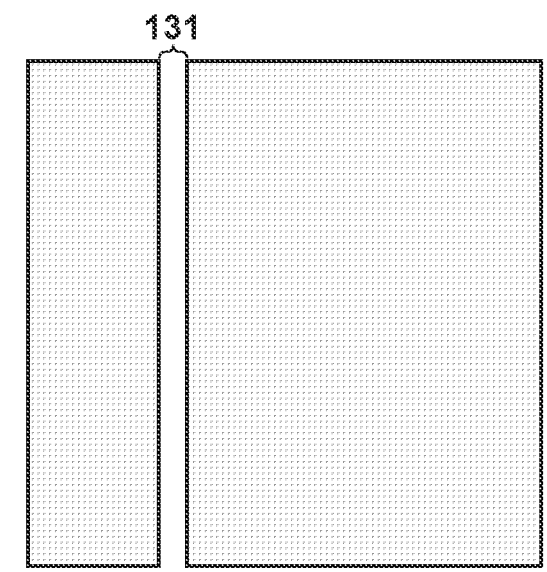

US 10,747,106 B2

IMPRINT APPARATUS

BACKGROUND OF THE INVENTION

Field of the Invention

The present invention relates to an imprint apparatus, an imprint method, and a method of manufacturing an article.

Description of the Related Art

An imprint technique is a technique capable of forming a nanoscale fine pattern, and is receiving attention as one mass production nanolithography technique for semiconductor devices and magnetic storage media. An imprint apparatus using the imprint technique forms a pattern on a substrate by curing a resin (imprint material) in a state in which a mold, on which the pattern is formed, and the resin on the substrate contact each other, and then releasing the mold from the cured resin.

In the imprint apparatus, it is effective to determine the normality/abnormality of a pattern formed on a substrate, that is, the normality/abnormality of imprint processing based on image sensing information from an image sensing unit arranged above the substrate (see Japanese Patent Laid-Open No. 2011-3616). Japanese Patent Laid-Open No. 2011-3616 discloses a technique of determining the normality/abnormality of imprint processing by comparing an image obtained by sensing a pattern formed on a substrate by imprint processing with a reference image prepared by sensing in advance a pattern normally formed on a substrate.

If the normality/abnormality of imprint processing is determined not after forming a pattern on a substrate, but during imprint processing, for example, upon generating an abnormality, the influence of the abnormality can be suppressed to increase the productivity. However, the state of the substrate during imprint processing changes to, for example, a state in which the imprint material is supplied (applied), a state in which the mold and the imprint material contact each other, and a state in which the mold is released to form a pattern. If the reference of determination of the normality/abnormality of imprint processing is constant, the reference may become improper depending on the substrate state, and the substrate state cannot be grasped accurately. That is, the normality/abnormality of imprint processing cannot be determined accurately in some cases. For example, while the pattern of the mold is filled with the imprint material on the substrate, the substrate state sequentially changes depending on the physical phenomenon (capillary phenomenon), and it is difficult to specify the timing to determine the normality/abnormality of imprint processing.

SUMMARY OF THE INVENTION

The present invention provides an imprint apparatus advantageous for determining the normality/abnormality of imprint processing.

According to one aspect of the present invention, there is provided an imprint apparatus that performs imprint processing of forming a pattern of an imprint material on a substrate using a mold, the apparatus including an image sensing unit configured to sense at least one of the mold and the substrate and obtain an image, and a determination unit configured to determine normality/abnormality of the imprint processing, wherein the imprint processing includes a first step of supplying the imprint material onto the substrate, and a second step of bringing the mold and the imprint material on the substrate into contact with each other, and the determination unit changes a reference of determination of the normality/abnormality of the imprint processing for each step of the imprint processing and determines the normality/abnormality of the imprint processing based on the image sensed by the image sensing unit.

Further aspects of the present invention will become apparent from the following description of exemplary embodiments with reference to the attached drawings.

BRIEF DESCRIPTION OF THE DRAWINGS

FIGS. 2A and 2B are views showing an example of interference fringes observed by the observation unit of the imprint apparatus shown in FIG. 1.

FIG. 3 is a flowchart for explaining general imprint processing.

FIGS. 12A to 12C are views for explaining the timing to perform the determination (step S206) of the normality/abnormality of imprint processing shown in FIG. 5.

FIGS. 13A to 13D are views for explaining determination (step S207) of the normality/abnormality of imprint processing shown in FIG. 5.

FIGS. 15A and 15B are views for explaining the determination (step S205) of the normality/abnormality of imprint processing shown in FIG. 5.

FIG. 16 is a view for explaining the determination (step S205) of the normality/abnormality of imprint processing shown in FIG. 5.

DESCRIPTION OF THE EMBODIMENTS

Figure 1:
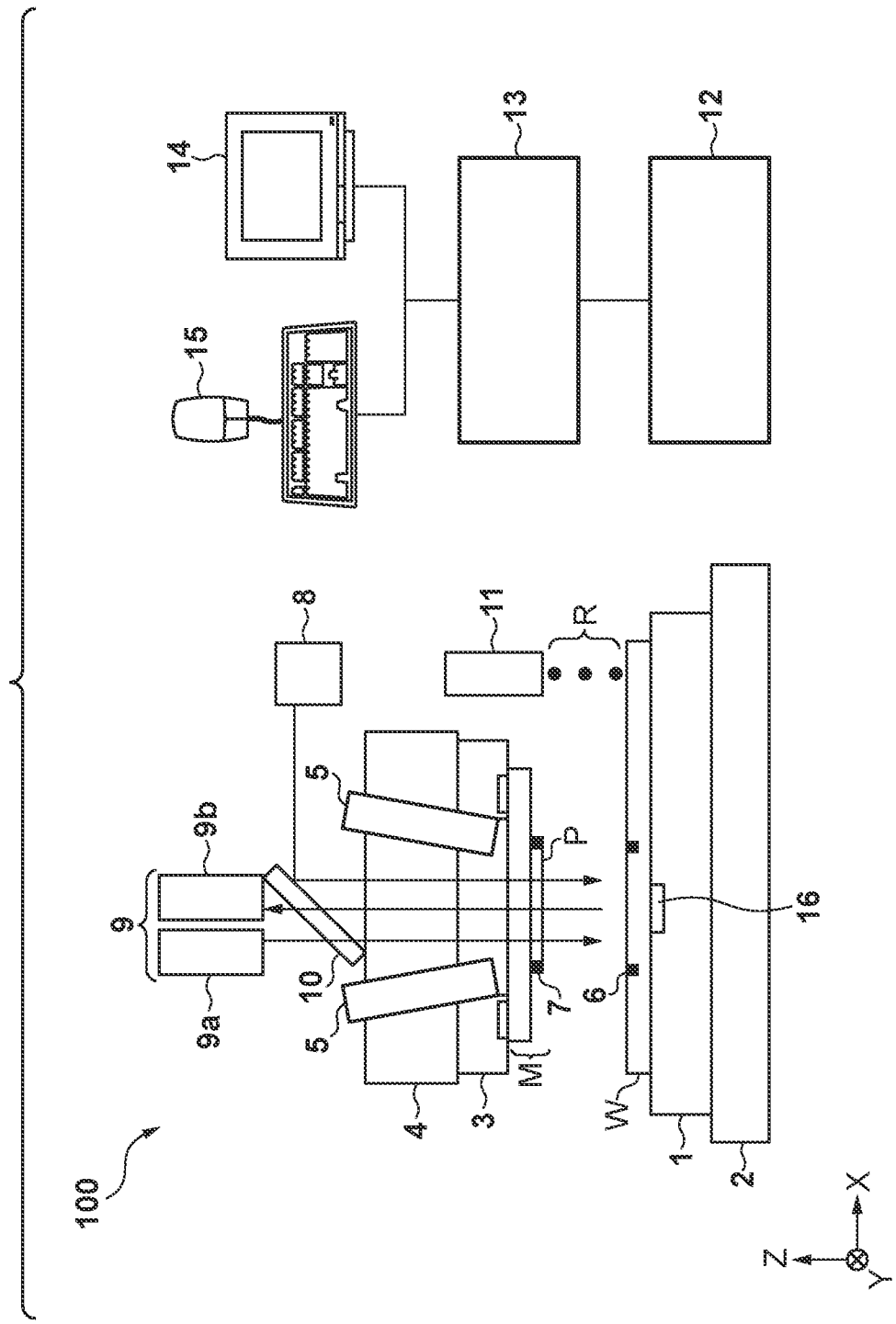
FIG. 1 is a schematic view showing the arrangement of an imprint apparatus as one aspect of the present invention.

Preferred embodiments of the present invention will be described below with reference to the accompanying drawings. Note that the same reference numerals denote the same members throughout the drawings, and a repetitive description thereof will not be given.

FIG. 1 is a schematic view showing the arrangement of an imprint apparatus 100 as one aspect of the present invention. The imprint apparatus 100 is a lithography apparatus that forms a pattern on an imprint material on a substrate using a mold. This embodiment will explain a case in which an ultraviolet curing resin that is cured by irradiation with ultraviolet rays is used as the imprint material. However, the imprint material may be a thermoplastic or thermosetting resin.

The imprint apparatus 100 includes a substrate chuck 1 that holds a substrate W, a substrate stage 2 that supports the substrate chuck 1 and moves, a mold chuck 3 that holds a mold M on which a pattern P is formed, and a mold stage 4 that supports the mold chuck 3 and moves. The imprint apparatus 100 also includes a dispenser 11 that supplies a resin R onto the substrate, and a control unit 12 that controls the overall imprint apparatus 100. Further, the imprint apparatus 100 includes a console unit 13 that generates an operation screen, a display unit 14 that displays an operation screen, an input device 15 including a keyboard and mouse, and a force sensor 16 that detects a force generated by a contact between the mold M and the resin R on the substrate. When the substrate W to which the resin R has been supplied by an external apparatus different from the imprint apparatus 100 is loaded into the imprint apparatus 100, the imprint apparatus 100 may not include the dispenser 11.

The imprint apparatus 100 performs imprint processing of forming a pattern on a substrate by curing the resin R in a state in which the mold M and the resin R on the substrate that has been supplied from the dispenser 11 contact each other, and then releasing the mold M from the cured resin R. Imprint processing includes a supply process, impress process, cure process, and release process. The supply process is a process (first step) of supplying the resin R onto a substrate. The impress process is a process (second step) of bringing the mold M and the resin R on the substrate into contact with each other. The pattern P of the mold M is filled with the resin R by bringing the mold M and the resin R on the substrate into contact with each other, that is, pressing the mold M against the resin R. The cure process is a process of curing the resin R in the state in which the mold M and the resin R on the substrate contact each other. The release process is a process (third step) of releasing the mold M from the cured resin R on the substrate.

A recessed portion larger in area than the pattern P is formed on a surface of the mold chuck 3 opposite to the pattern surface of the mold M. The recessed portion is enclosed by the mold M and a seal glass (not shown) to define an enclosed space (cavity). A pressure control unit (not shown) is connected to the cavity, and can control the pressure of the cavity. When bringing the mold M and the resin R on the substrate into contact with each other, the pressure of the cavity is raised to deform the mold M into a shape projecting toward the substrate, thereby suppressing entrapment of bubbles between the mold M and the resin R on the substrate. When the mold M and the resin R on the substrate contact each other, the pressure of the cavity is returned so that the mold M becomes parallel to the substrate W (completely contacts the resin R on the substrate).

The imprint apparatus 100 further includes an alignment scope 5 that detects an alignment mark (substrate-side mark) 6 provided on the substrate W, and an alignment mark (mold-side mark) 7 provided on the mold M. The alignment scope 5 functions as an alignment detection unit that detects the substrate-side mark 6 formed in a shot region on the substrate W and the mold-side mark 7 formed on the pattern P of the mold M, and generates an alignment signal. As a method of detecting the substrate-side mark 6 and the mold-side mark 7, for example, a method of detecting moire fringes (interference fringes) reflecting the relative positions of two marks can be used. It is also possible to detect the images of the substrate-side mark 6 and mold-side mark 7 and obtain the relative positions of the two marks.

The control unit 12 includes a CPU and a memory, and controls each unit of the imprint apparatus 100 to perform imprint processing. For example, the control unit 12 obtains the relative positions (position deviation) of the mold M and substrate W based on the detection results of the substrate-side mark 6 and mold-side mark 7 by the alignment scope 5. The control unit 12 moves the substrate stage 2 and the mold stage 4 so as to correct the position deviation between the mold M and the substrate W based on the relative positions of the mold M and substrate W. The position deviation between the mold M and the substrate W contains a shift component, a magnification component, a rotation component, and the like. Further, the control unit 12 can correct the shape of the pattern P of the mold M in accordance with the shape of a shot region on the substrate W by using, for example, a pressure finger (not shown) arranged around the mold M. In this embodiment, the control unit 12 functions as a determination unit that determines the normality/abnormality of imprint processing, which will be described later.

The imprint apparatus 100 further includes a light source 8 that radiates ultraviolet rays, an observation unit 9 that observes at least either of the mold M and substrate W, and a mirror 10. The mirror 10 includes dichroic mirror, and has a characteristic in which the mirror 10 reflects ultraviolet rays from the light source 8 and transmits light (observation light) from the observation unit 9. Ultraviolet rays from the light source 8 are reflected by the mirror 10 to irradiate the resin R on the substrate via the mold M and cure the resin R, thereby forming the pattern P of the mold M on the substrate.

The observation unit 9 includes an observation light source 9a and an image sensor 9b, and functions as an image sensing unit that senses at least either of the mold M and substrate W to obtain an image. Observation light from the observation light source 9a passes through the mirror 10 and the mold M, and illuminates the substrate W (shot region). The image sensor 9b detects, as observation light, light reflected by the surface of the substrate W and light reflected by the pattern surface of the mold M. As described above, when bringing the mold M and the resin R on the substrate into contact with each other, the mold M is deformed into a shape projecting toward the substrate. Thus, the gap between the mold M and the substrate W continuously changes from the portion where the mold M and the substrate W contact each other. The image sensor 9b senses interference fringes, a so-called Newton ring, between light reflected by the surface of the substrate W and light reflected by the pattern surface of the mold M. FIGS. 2A and 2B are views showing an example of interference fringes observed by the observation unit 9. FIG. 2A shows a gap between the mold M and the substrate W, and FIG. 2B shows an image sensed by the image sensor 9b.

General imprint processing will be explained with reference to FIGS. 3 and 4A to 4F. As shown in FIG. 3, imprint processing includes a supply process (step S101), impress process (step S102), cure process (step S103), and release process (step S104). FIGS. 4A to 4F are views showing changes of the state of the substrate W in imprint processing.

Figure 4A:
FIGS. 4A to 4F are views for explaining general imprint processing.

FIG. 4A shows a state of the substrate W before the start of imprint processing. As shown in FIG. 4A, the substrate W is unprocessed.

Figure 4B:

FIG. 4B shows a state of the substrate W having undergone the supply process. In the supply process, the resin R is supplied to the substrate W by discharging droplets of the resin R from the dispenser 11 onto the substrate. As shown in FIG. 4B, droplets of the resin R are supplied to predetermined positions on the substrate, forming the layout of the droplets of the resin R on the substrate.

Figure 4C:
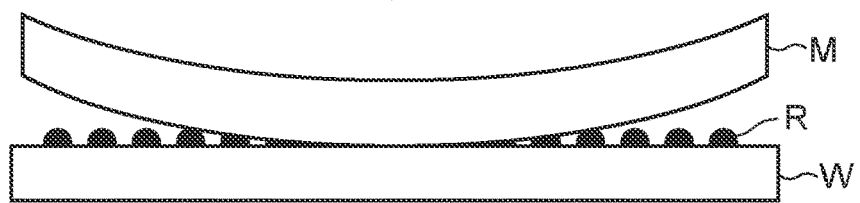

FIG. 4C shows a state of the substrate W in the impress process. In the impress process, as shown in FIG. 4C, the mold M is brought close to the substrate W in a state in which the mold M is deformed into a shape projecting toward the substrate side, thereby gradually bringing the mold M into contact with the resin R on the substrate from the center to periphery of the mold M. In the impress process, a gap is generated between the mold M and the substrate W, and interference fringes as shown in FIG. 2B are observed.

Figure 4D:
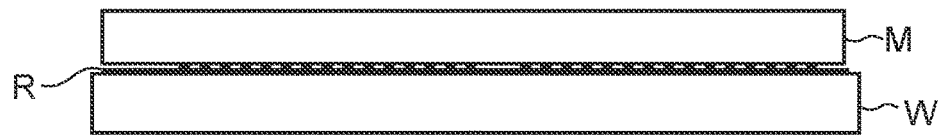

FIG. 4D shows a state of the substrate W in the cure process. In the cure step, the resin R is irradiated with ultraviolet rays from the light source 8 and cured in a state in which the mold M and the resin R on the substrate contact each other. In the cure step, as shown in FIG. 4D, the mold M and the resin R on the substrate completely contact each other, and the pattern P of the mold M is filled with the resin R.

Figure 4E:
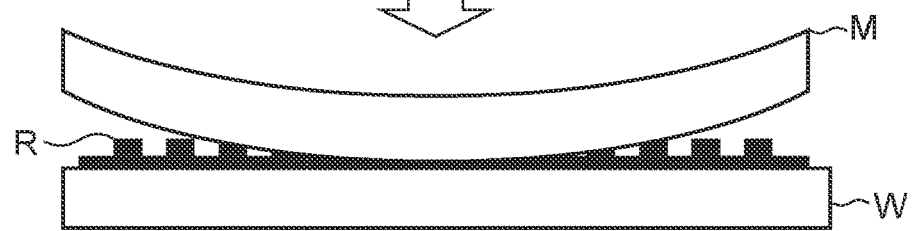

FIG. 4E shows a state of the substrate W in the release process. In the release process, the mold M is released from the substrate W while deforming the mold M into a shape projecting toward the substrate, as shown in FIG. 4E, in order to reduce a release force, which is a force for releasing the mold M from the cured resin R on the substrate. In the release process, as in the impress process, a gap is generated between the mold M and the substrate W, and interference fringes as shown in FIG. 2B are observed.

Figure 4F:
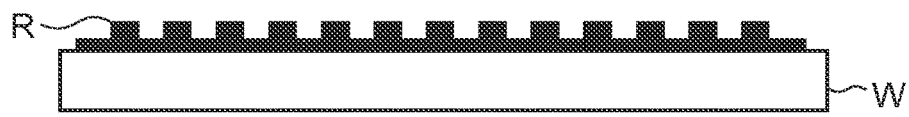

FIG. 4F shows a state of the substrate W at the end of imprint processing. As shown in FIG. 4F, the pattern of the resin R corresponding to the pattern P of the mold M is formed.

In this manner, the state of the substrate W during imprint processing changes in accordance with each process of imprint processing. In the related art, the normality/abnormality of imprint processing is determined after the pattern of the resin R corresponding to the pattern P of the mold M is formed on the substrate W (state of the substrate W shown in FIG. 4F). In other words, the related art is specialized in determining the normality/abnormality of imprint processing after the release process, and the normality/abnormality of imprint processing cannot be accurately determined in another process of imprint processing.

In this embodiment, the normality/abnormality of imprint processing is determined during imprint processing, that is, in each process of imprint processing. At this time, the reference of determination of the normality/abnormality of imprint processing is changed for each process of imprint processing, which will be described later. In other words, the determination of the normality/abnormality of imprint processing is switched to one suitable for each of the supply process (step S101), impress process (step S102), cure process (step S103), and release process (step S104) shown in FIG. 3, that is, for each state of the substrate W.

Figure 5:
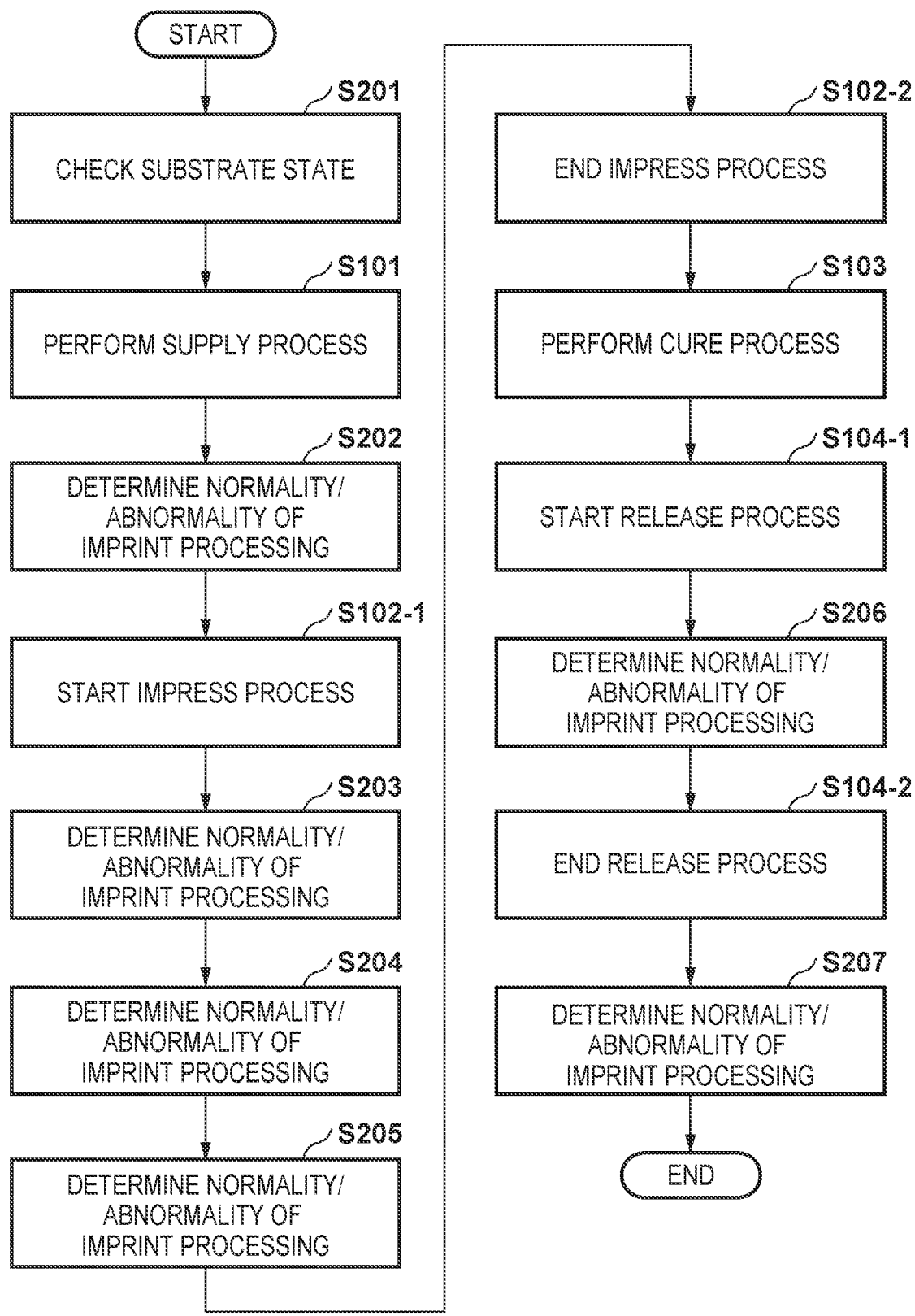
FIG. 5 is a flowchart for explaining imprint processing according to an embodiment.

FIG. 5 is a flowchart for explaining imprint processing according to this embodiment. The imprint processing according to this embodiment similarly includes the supply process (step S101), impress process (step S102), cure process (step S103), and release process (step S104). These processes have been described above, and a detailed description thereof will not be repeated. In FIG. 5, the impress process (step S102) is divided into the start (step S102-1) of the impress process in which an operation of moving the mold M and the substrate W relatively close to each other is started, and the end (step S102-2) of the impress process in which this operation is ended. Similarly, the release process (step S104) is divided into the start (step S104-1) of the release process in which an operation of moving the mold M and the substrate W relatively apart from each other is started, and the end (step S104-2) of the release process in which this operation is ended.

In step S201, the state of the substrate W before the start of imprint processing is checked. For example, whether a particle (foreign particle or dust) or the like is attached to the substrate W is checked using the observation unit 9 or the like.

Figure 6A:
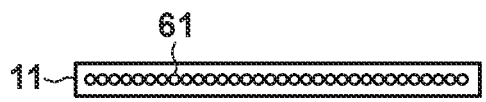
FIGS. 6A to 6F are views for explaining determination (step S202) of the normality/abnormality of imprint processing shown in FIG. 5.
Figure 6D:
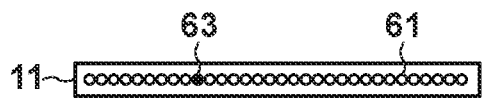

In step S202, the normality/abnormality of imprint processing is determined based on an image sensed by the observation unit 9 (image sensor 9b) in the supply process (step S101). In the imprint apparatus 100, the dispenser 11 has an arrangement in which a plurality of orifices 61 for discharging droplets of the resin R are laid out in a line, as shown in FIGS. 6A and 6D, in order to shorten the time taken to supply the resin R to the substrate W. In the supply process (step S101), the resin R is supplied to the substrate W by discharging droplets of the resin R from the plurality of orifices 61 of the dispenser 11 while moving the substrate stage 2 in a scan direction 62, as shown in FIGS. 6B and 6E.

Figure 6B:
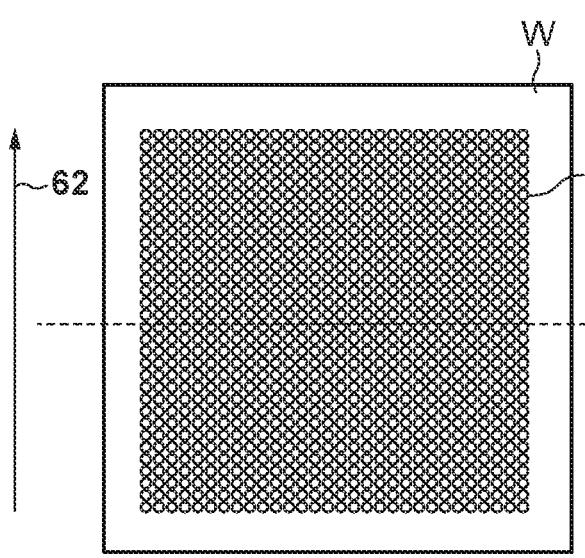

FIG. 6B shows an image sensed by the image sensor 9b when the supply of the resin R to the substrate W was normally performed, and shows the layout of droplets of the resin R on the substrate to which the dispenser 11 has supplied the resin R. Referring to FIG. 6B, it can be confirmed that droplets of the resin R have uniformly been formed on the substrate, and droplets of the resin R that should be supplied to the substrate are not omitted.

Figure 6E:
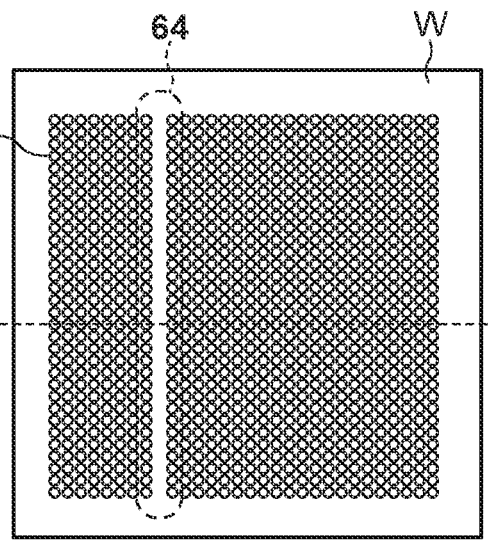

To the contrary, FIG. 6E shows an image sensed by the image sensor 9b when the supply of the resin R to the substrate W was not normally performed, for example, when dust is attached to an orifice 63 out of the plurality of orifices 61 of the dispenser 11 and droplets of the resin R cannot be discharged. Referring to FIG. 6E, it can be confirmed that droplets of the resin R are omitted in a region 64 on the substrate corresponding to the orifice 63 of the dispenser 11.

In the determination of the normality/abnormality of imprint processing in step S202, it is determined whether droplets of the resin R that should be supplied to the substrate are omitted. As a reference for determining the normality/abnormality of imprint processing, an image of droplets of the resin R normally discharged from the dispenser 11 is used. At this time, (the layout of droplets of the resin R in) an image sensed by the image sensor 9b in the supply process is compared with (the reference layout of droplets of the resin R in) a reference image obtained when the dispenser 11 normally discharged droplets of the resin R.

Figure 6C:
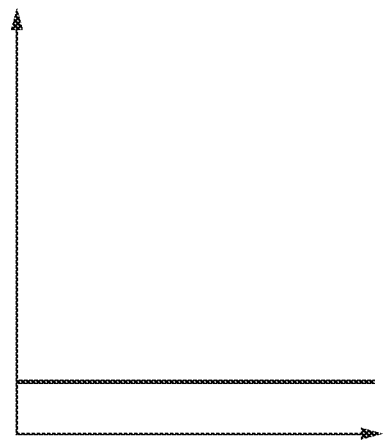
Figure 6F:
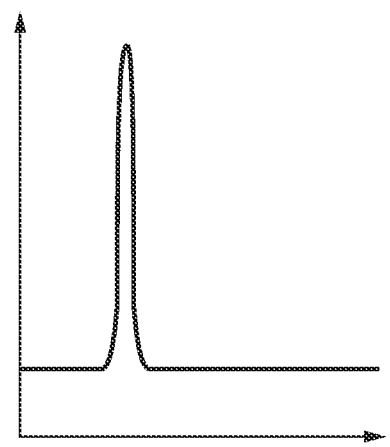

The determination of the normality/abnormality of imprint processing in step S202 will be explained in detail by exemplifying a case in which variations of the luminance in an image sensed by the image sensor 9b are used. FIG. 6C is a graph showing the luminance of the image shown in FIG. 6B along a broken line 65. In FIG. 6C, the ordinate represents the luminance in the image, and the abscissa represents the position in the image. When the supply of the resin R to the substrate W was normally performed, the luminance in the image sensed by the image sensor 9b less varies, as shown in FIG. 6C. FIG. 6F is a graph showing the luminance of the image (reference image) shown in FIG. 6E along the broken line 65. In FIG. 6F, the ordinate represents the luminance in the image, and the abscissa represents the position in the image. When the supply of the resin R to the substrate W was not normally performed, the luminance at a portion corresponding to the orifice 63 of the dispenser 11 differs from the luminance at the remaining portions, as shown in FIG. 6F. An image sensed by the image sensor 9b in the supply process is compared with the reference image, and when variations of the luminance in the image exceed a predetermined range, it can be determined that droplets of the resin R that should be supplied onto the substrate are omitted, that is, imprint processing is abnormal.

In step S202, the normality/abnormality of imprint processing is determined. If it is determined that imprint processing is abnormal, the imprint processing is stopped, and it can be prevented to produce defectives in which, for example, part of a pattern on a substrate is lost. If the omission of droplets of the resin R that should be supplied onto the substrate is detected as an abnormality of imprint processing in step S202, a removal process for dust attached to the dispenser 11 (orifices) is automatically performed, and the imprint processing can be continued.

In step S203, the normality/abnormality of imprint processing is determined based on an image sensed by the observation unit 9 (image sensor 9b) after the start (step S102-1) of the impress process. In the determination of the normality/abnormality of imprint processing in step S203, it is determined whether a particle is attached to the substrate W.

The determination of the normality/abnormality of imprint processing in step S203 will be explained in detail. Here, whether a particle is attached to the substrate W is determined using a difference image representing the difference in luminance for each pixel at the same position between a reference image and an image sensed by the image sensor 9b after the start (step S102-1) of the impress process. As a reference for determining the normality/abnormality of imprint processing, an image obtained when the impress process was normally performed is used. The reference image is an image sensed by the image sensor 9b after the start (step S102-1) of the impress process when imprint processing is normal.

Figure 7A:
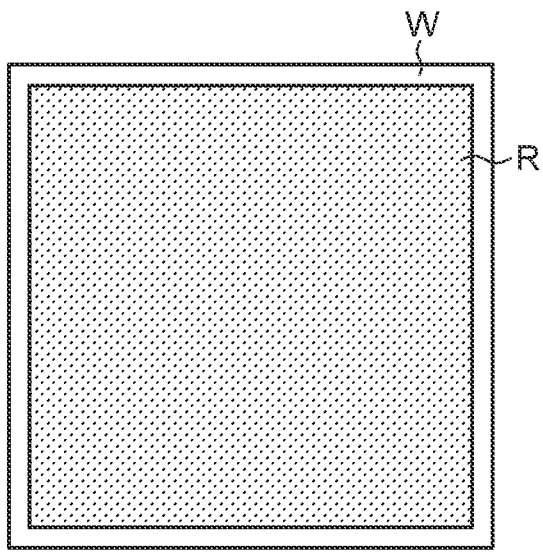
FIGS. 7A to 7D are views for explaining determination (step S203) of the normality/abnormality of imprint processing shown in FIG. 5.
Figure 7C:
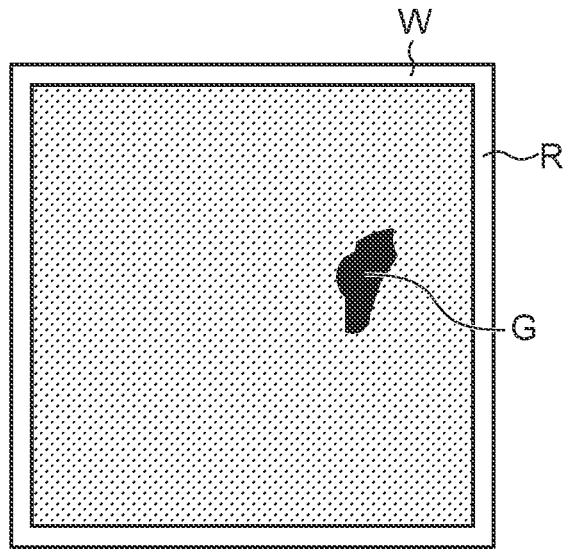
Figure 7B:
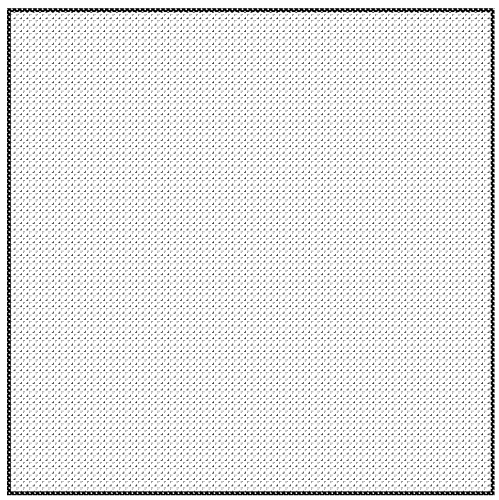
Figure 7D:
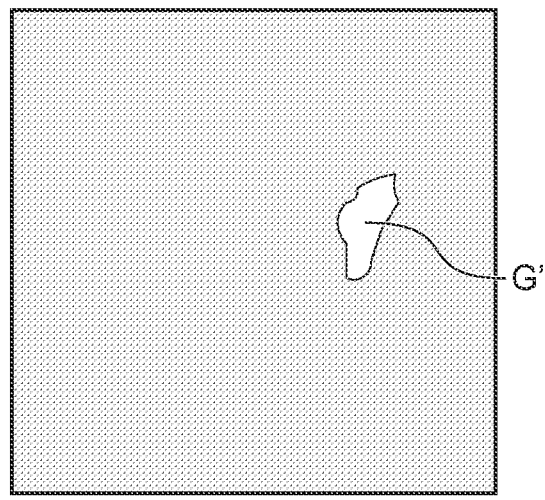

FIG. 7B shows a difference image obtained when no particle is attached to the substrate W, as shown in FIG. 7A. The difference image shown in FIG. 7B is a difference image that does not greatly change and includes only low luminance values. This is because normal images are compared with each other. FIG. 7D shows a difference image obtained when a particle G is attached to the substrate W, as shown in FIG. 7C. The difference image shown in FIG. 7D is a difference image that includes even a high luminance value because a large difference is generated between the image and the reference image at a portion G' where the particle G attached to the substrate W exists. When the difference image between the reference image and the image sensed by the image sensor 9b after the start of the impress process includes a luminance value exceeding a predetermined luminance value, it can be determined that the particle G is attached to the substrate W, that is, imprint processing is abnormal.

If the impress process continues in a state in which the particle G is attached to the substrate W, the mold M and the particle G may contact each other to damage the pattern P of the mold M. Thus, the determination (step S203) of whether the particle G is attached to the substrate W is preferably performed at a timing when the mold M and the resin R on the substrate contact each other. It can therefore be early determined that the particle G is attached to the substrate W (abnormality of imprint processing). When the particle G is attached to the substrate W, the impress process is stopped and the damage of the mold M can be avoided. Not only the particle G attached to the substrate, but also a particle attached to the mold M can be determined. In this manner, the presence/absence of a particle between the mold M and the substrate W can be determined (detected).

Figure 8:
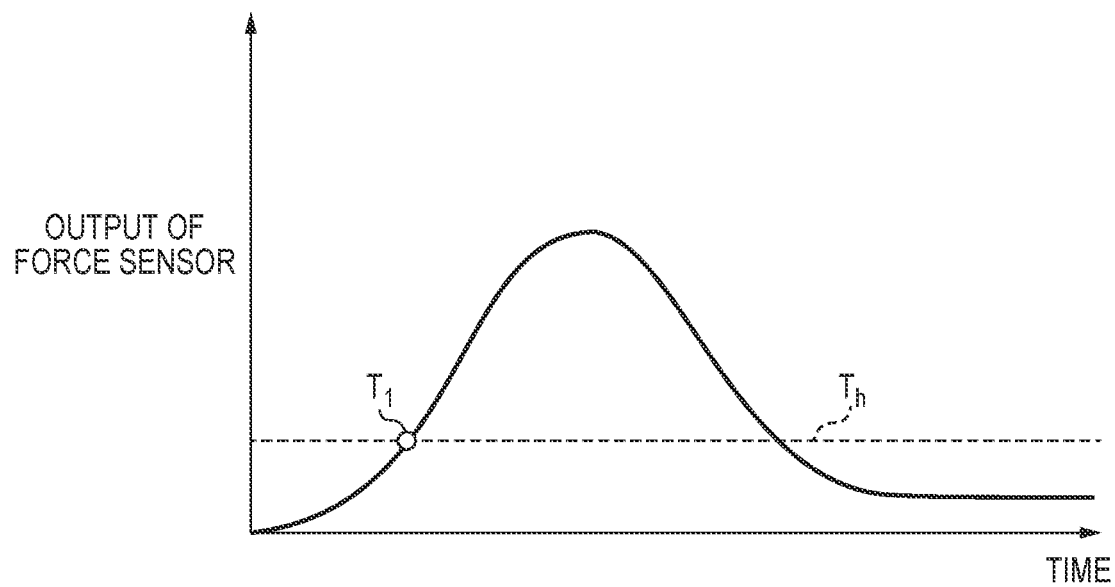
FIG. 8 is a graph for explaining the timing to perform the determination (step S203) of the normality/abnormality of imprint processing shown in FIG. 5.

To detect the timing when the mold M and the resin R on the substrate contact each other, the force sensor 16 is used. FIG. 8 is a graph for explaining the timing to perform the determination (step S203) of the normality/abnormality of imprint processing. In FIG. 8, the ordinate represents the output (force detected by the force sensor 16) of the force sensor 16 arranged on the substrate chuck 1, and the abscissa represents the time from the start of the impress process to the end of the impress process. FIG. 8 shows a change of the force (impress force) generated by the contact between the mold M and the resin R on the substrate in the impress process. Referring to FIG. 8, the mold M and the resin R on the substrate are spaced apart from each other at the start time of the impress process, so the output of the force sensor 16 is 0. As the impress process proceeds, and the mold M and the resin R on the substrate start contacting each other, the output of the force sensor 16 gradually increases. At the timing when the force sensor 16 detects a force generated by the contact between the mold M and the resin R on the substrate, it is determined whether the particle G is attached to the substrate W. In some cases, there is a time allowance until the mold M and the particle G attached to the substrate W contact each other after the mold M and the resin R on the substrate contact each other. In such a case, it may be determined whether the particle G is attached to the substrate W at a timing $T_1$ when the output of the force sensor 16 exceeds a threshold Th. Note that the timing when the mold M and the resin R on the substrate contact each other can also be detected not using the force sensor 16, but using an image sensed by the observation unit 9 (image sensor 9b). For example, the presence/absence of a particle between the mold M and the substrate W is determined at the timing when the size (diameter) of interference fringes sensed by the image sensor 9b becomes larger than a predetermined size PS.

In step S204 parallel to step S203, the normality/abnormality of imprint processing is determined based on an image sensed by the observation unit 9 (image sensor 9b) after the start (step S102-1) of the impress process. As a reference for determining the normality/abnormality of imprint processing, the image of interference fringes sensed by the image sensor 9b is used. In the determination of the normality/abnormality of imprint processing in step S204, the contact state between the mold M and the resin R on the substrate, and the mutual postures of the mold M and resin R are determined based on interference fringes as shown in FIG. 2B. For example, information about at least either of the position and roundness of sensed interference fringes as shown in FIG. 2B is obtained. Based on this information, it is determined whether the mold M in a tilt state contacts the resin R on the substrate. The information about at least either of the position and roundness of interference fringes can be obtained by comparing interference fringes sensed by the image sensor 9b after the start of the impress process with reference interference fringes obtained when the mold M and the resin R on the substrate normally contacted each other. Note that the determination of the normality/abnormality of imprint processing in step S204 is the same as the determination (step S205) of the normality/abnormality of imprint processing performed after the start (step S104-1) of the release process (to be described later), and a detailed description thereof will not be repeated.

Figure 9:
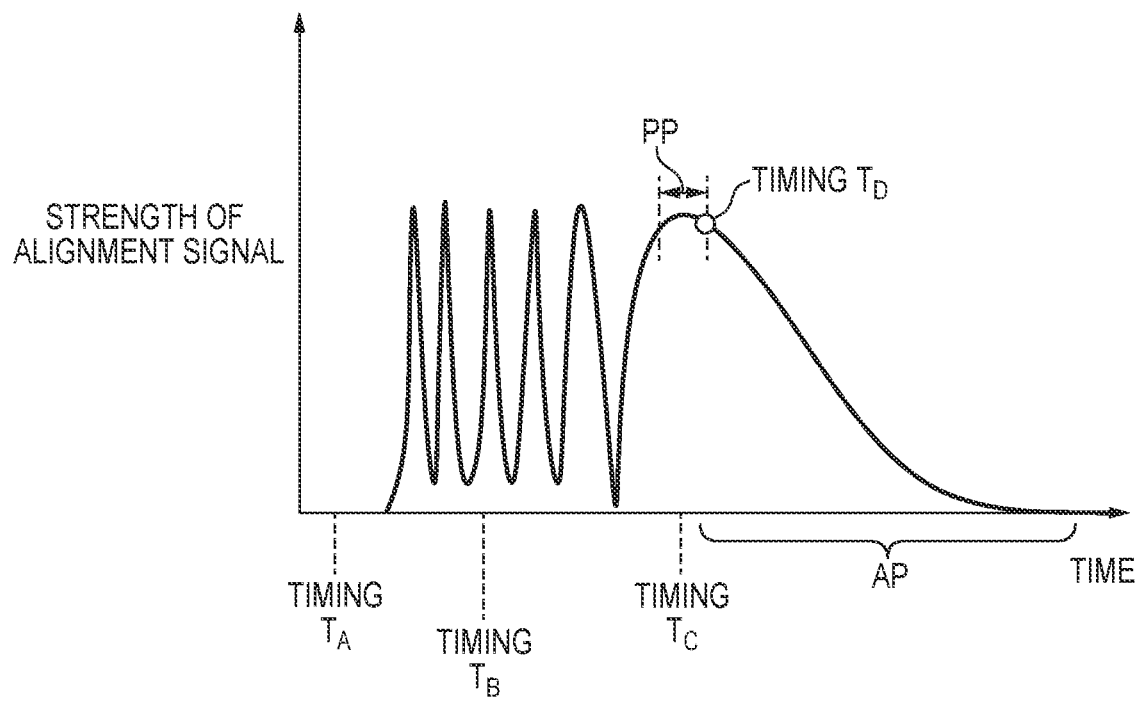
FIG. 9 is a graph for explaining the timing to perform determination (step S204) of the normality/abnormality of imprint processing shown in FIG. 5.

The timing to perform the determination (step S204) of the normality/abnormality of imprint processing will be explained with reference to FIGS. 9 and 10A to 10C. FIG. 9 shows an alignment signal generated by the alignment scope 5. In FIG. 9, the ordinate represents the strength of the alignment signal, and the abscissa represents the time from the start of the impress process to the end of the impress process.

Figure 10A:
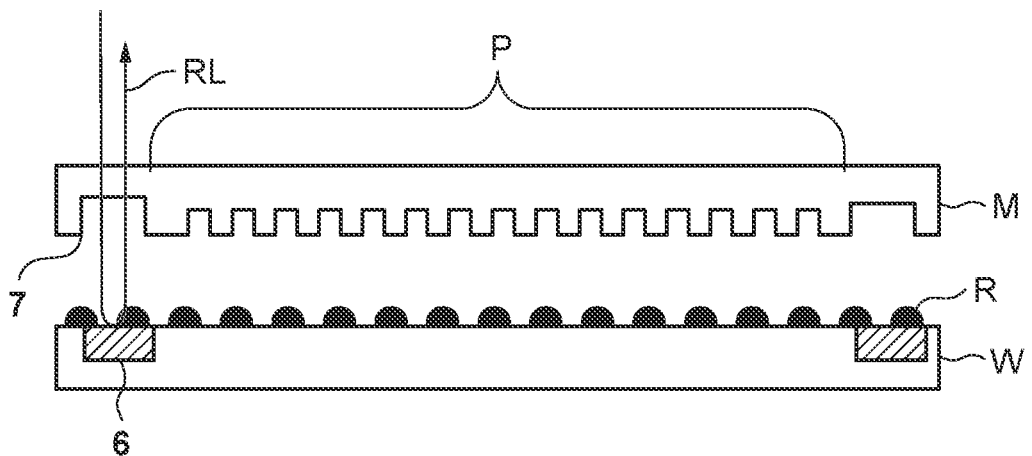
FIGS. 10A to 10C are views for explaining the timing to perform the determination (step S204) of the normality/abnormality of imprint processing shown in FIG. 5.

FIG. 10A shows the states of the mold M and substrate W at a timing $T_A$ shown in FIG. 9. The alignment scope 5 detects the mold-side mark 7 and the substrate-side mark 6 by detecting reflected light RL. When the mold-side mark 7 and the substrate-side mark 6 are spaced apart from each other, as shown in FIG. 10A, they cannot be detected, and the alignment signal shown in FIG. 9 is not generated.

Figure 10B:
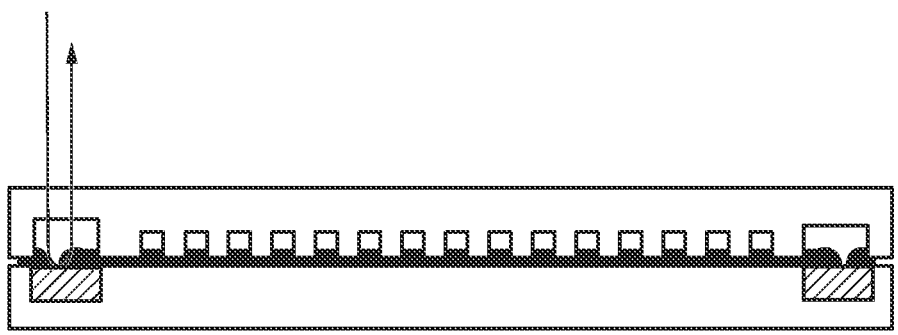

FIG. 10B shows the states of the mold M and substrate W at a timing $T_B$ shown in FIG. 9. As shown in FIG. 10B, at the timing $T_B$, the mold M and the resin R on the substrate contact each other, and the resin R starts filling the pattern P of the mold M. As the mold-side mark 7 and the substrate-side mark 6 come close to each other, the mold-side mark 7 and the substrate-side mark 6 are being detected. However, while the filling of the pattern P of the mold M with the resin R progresses, the reflected light RL fluctuates depending on the motion of the resin R. Hence, the alignment signal generated by the alignment scope 5 varies, as shown in FIG. 9.

Figure 10C:
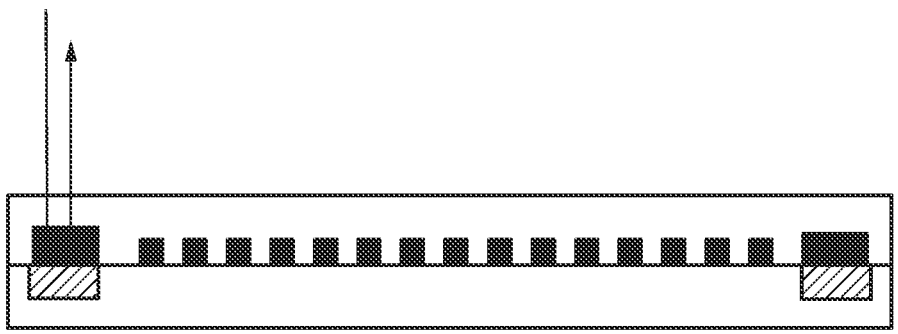

FIG. 10C shows the states of the mold M and substrate W at a timing $T_C$ shown in FIG. 9. As shown in FIG. 10C, at the timing $T_C$, the pattern P of the mold M is sufficiently filled with the resin R on the substrate, so the resin R does not move and the reflected light RL is stabilized. Thus, the alignment signal generated by the alignment scope 5 is also stabilized, as shown in FIG. 9.

From this, whether the mold M in a tilt state contacts the resin R on the substrate at a timing $T_D$ when the alignment signal generated by the alignment scope 5 is stabilized in a preset period PP, as shown in FIG. 9. By using the alignment scope 5, the timing to perform the determination (step S204) of the normality/abnormality of imprint processing can be specified. However, the present invention is not limited to this, and the timing to perform the determination (step S204) of the normality/abnormality of imprint processing may be specified using the force sensor 16, as described above, instead of the alignment scope 5. In this case, whether the mold M in a tilt state contacts the resin R on the substrate is determined at the timing when the output of the force sensor 16 exceeds the threshold or the timing when the force sensor 16 detects a force generated by the contact between the mold M and the resin R on the substrate.

In the impress process, alignment between the mold M and the substrate W is performed based on the detection result of the alignment scope 5 in a period AP shown in FIG. 9. The normality/abnormality of imprint processing is determined at the timing $T_C$. If it is determined that imprint processing is abnormal, the imprint processing is stopped, and unnecessary alignment between the mold M and the substrate W can be prevented.

In step S205 parallel to steps S203 and S204, the normality/abnormality of imprint processing is determined based on the image sensed by the observation unit 9 (image sensor 9b) after the start (step S102-1) of the impress process. In the determination of the normality/abnormality of imprint processing in step S205, it is determined whether droplets of the resin R that should be supplied from the dispenser 11 onto the substrate are omitted.

Figure 14A:
FIGS. 14A and 14D are views for explaining determination (step S205) of the normality/abnormality of imprint processing shown in FIG. 5.
Figure 14C:
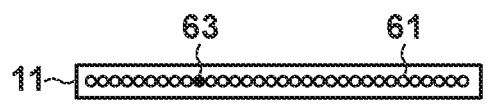

In the imprint apparatus 100, the dispenser 11 has an arrangement in which the plurality of orifices 61 for discharging droplets of the resin R are laid out in a line, as shown in FIGS. 14A and 14C, in order to shorten the time taken to supply the resin R to the substrate W. In the supply process (step S101), the resin R is supplied to the substrate W by discharging droplets of the resin R from the plurality of orifices 61 of the dispenser 11 while moving the substrate stage 2 in the scan direction 62, as shown in FIGS. 14B and 14D.

Figure 11A:
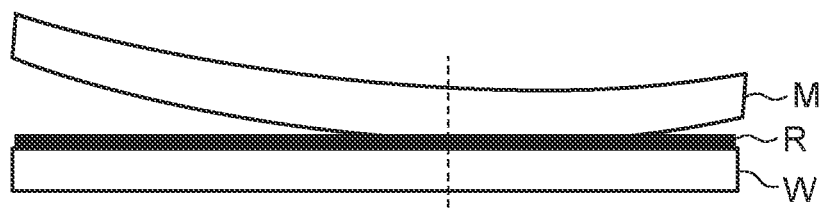
FIGS. 11A and 11B are views for explaining determination (step S206) of the normality/abnormality of imprint processing shown in FIG. 5.
Figure 11B:
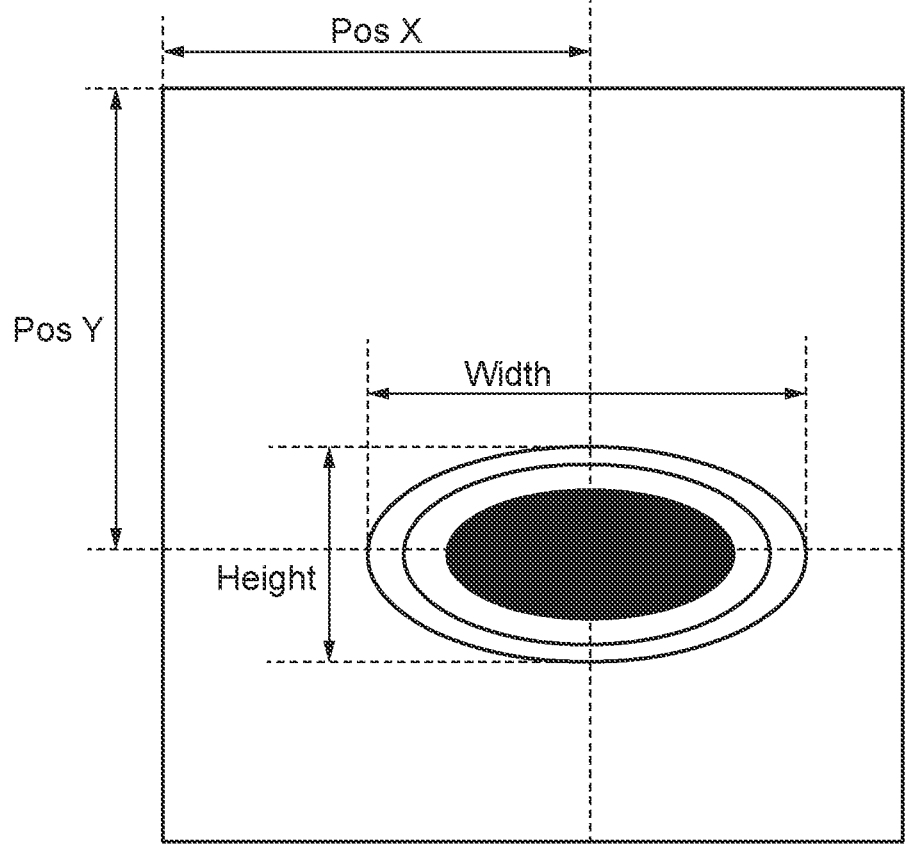
Figure 14B:
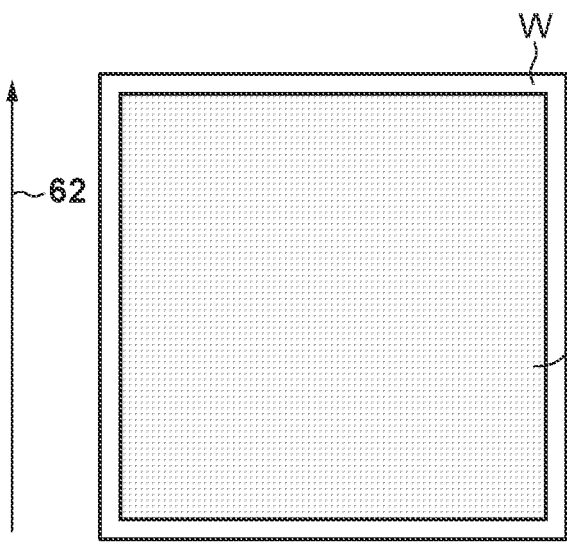

FIG. 14B shows an image sensed by the image sensor 9b during the impress process when the supply of the resin R to the substrate W was normally performed, and shows a state in which the pattern P of the mold M is filled with the resin R by the impress process. FIG. 14B shows interference fringes at the timing after the impress process proceeds, and a circle at the center of the interference fringes spreads to the entire surface of the mold M (pattern P) in the interference fringes (FIGS. 2A and 2B) observed in the impress process. Referring to FIG. 11B, it can be confirmed that the luminance of pixels does not vary in a region corresponding to the mold M (pattern P), and droplets of the resin R that should be supplied onto the substrate are not omitted.

Figure 14D:
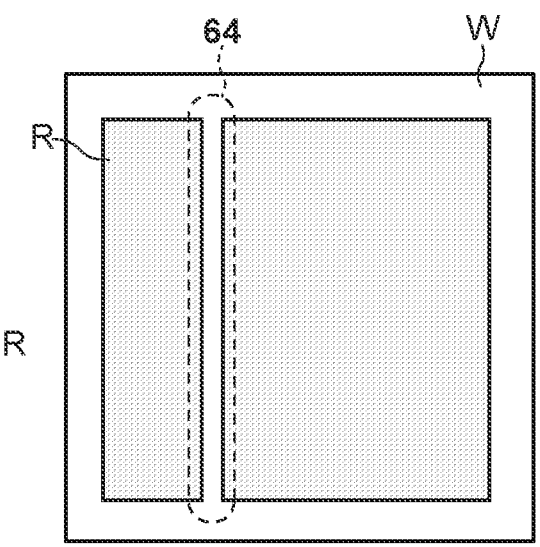

In contrast, FIG. 14D shows an image sensed by the image sensor 9b during the impress process when the supply of the resin R to the substrate W was not normally performed. The case in which the supply of the resin R to the substrate W was not normally performed is, for example, a case in which dust is attached to the orifice 63 out of the plurality of orifices 61 of the dispenser 11, and droplets of the resin R cannot be discharged from the orifice 63. Referring to FIG. 14D, it can be confirmed that the luminance of pixels in the region 64 on the substrate corresponding to the orifice 63 of the dispenser 11 is different from that in the remaining region.

FIGS. 15A and 15B are views for explaining interference fringes observed in FIG. 14D. FIG. 15A shows a gap between the mold M and the substrate W while the impress process is performed, and the state of filling the pattern P of the mold M with the resin R. FIG. 15B shows part of an image sensed by the image sensor 9b. Referring to FIG. 15B, the mold M and resin R close in refractive index contact each other in a region 121 where droplets of the resin R are not omitted, so the reflectance at the interface between the mold M and the resin R becomes very low. Thus, reflected light in the region 121 where droplets of the resin R are not omitted becomes weak, and a dark image is obtained in the image sensor 9b.

In a region 122 where droplets of the resin R are omitted, a gap exists between the mold M and the resin R. Light reflected by the mold M and light reflected by the resin R interfere with each other, and a bright image is obtained in the image sensor 9b. In other words, a region where a gap exists between the mold M and the resin R yields a bright image. Since the omission of droplets of the resin R can be detected in a region larger in size than one droplet of the actual resin R, the observation unit 9 (image sensor 9b) having a resolution lower than a resolution necessary to detect one droplet of the resin R can detect the omission of droplets of the resin R.

In this way, whether droplets of the resin R that should be supplied from the dispenser 11 onto the substrate are omitted can be determined from the image in FIG. 14D obtained by the image sensor 9b. Note that interference fringes include a case in which there is one bright streak owing to the omission of droplets at one portion, as shown in FIG. 11D, and a case in which a plurality of variable-density streaks are repeated owing to the omission of droplets at a plurality of portions.

As described above, in the determination of the normality/abnormality of imprint processing in step S205, it is determined whether droplets of the resin R that should be supplied from the dispenser 11 onto the substrate are omitted. At this time, an image sensed by the image sensor 9b in the impress process is compared with a reference image obtained when the dispenser 11 normally discharged droplets of the resin R. The determination of the normality/abnormality of imprint processing in step S205 will be explained in detail by exemplifying a case in which the presence/absence of a vertical streak (bright/dark line) in the scan direction (moving direction) in an image sensed by the image sensor 9b is used.

FIG. 16 shows a difference image between the image shown in FIG. 14B and the image shown in FIG. 14D. Referring to FIG. 16, a pixel having a difference becomes white, and a pixel having no difference becomes dark in the difference image. A boundary 131 at which the brightness of a pixel changes is extracted from the difference image. The presence/absence of a vertical streak in the scan direction is determined based on whether the boundary 131 is parallel to the scan direction 62, that is, whether the boundary 131 is approximate to a straight line indicating the scan direction 62.

In this embodiment, the determination of whether droplets of the resin R are omitted is performed even in step S202. In step S202, droplets of the resin R on the substrate are directly observed, so the luminance of each pixel changes depending on the presence/absence of a droplet in an image obtained by the image sensor 9b, as shown in FIG. 6B. To the contrary, in step S205, the impress process is started, interference fringes when the pattern P of the mold M is filled with the resin R are observed, and the luminance of each pixel hardly changes, as shown in FIGS. 14B and 14D. In step S205, compared to step S202, a low resolution of the image sensor 9b is permitted, and the omission of droplets of the resin R can be detected as a clearer vertical streak.

Note that the timing to perform the determination (step S205) of the normality/abnormality of imprint processing may be the timing when the pattern P of the mold M is filled with the resin R, like the timing $T_D$ shown in FIG. 9. The region 64 (vertical streak) detected when droplets of the resin R are omitted can be detected even during filling with the resin R during which the interference fringes shown in FIGS. 2A and 2B are obtained. Therefore, the timing to perform the determination (step S205) of the normality/abnormality of imprint processing is not limited to the timing $T_D$ shown in FIG. 9, and can be an arbitrary timing when the region 64 shown in FIG. 14D can be detected.

In step S205, the normality/abnormality of imprint processing is determined. If it is determined that imprint processing is abnormal, the imprint processing is stopped, and it can be prevented to produce defectives in which, for example, part of a pattern on a substrate is lost. If the omission of droplets of the resin R that should be supplied onto the substrate is detected as an abnormality of imprint processing in step S205, a removal process for dust attached to the dispenser 11 (orifices) is automatically performed, and the imprint processing can be continued.

In step S206, the normality/abnormality of imprint processing is determined based on an image sensed by the observation unit 9 (image sensor 9b) after the start (step S104-1) of the release process. In the release process, if the mold M in a tilt state is released from the cured resin R on the substrate, as shown in FIG. 11A, the pattern of the resin R formed on the substrate may fall down or be damaged.

In the determination of the normality/abnormality of imprint processing in step S206, whether the mold M in a tilt state is being released from the cured resin R on the substrate is determined based on interference fringes as shown in FIG. 2B or 11B. As a reference for determining the normality/abnormality of imprint processing, the image of interference fringes sensed by the image sensor 9b is used. More specifically, positions Pos X and Pos Y, and a roundness (ratio of Width and Height) of interference fringes are obtained first, as shown in FIG. 11B. The positions and roundness of interference fringes can be obtained by comparing interference fringes sensed by the image sensor 9b after the start of the release process with reference interference fringes obtained when the mold M was normally released from the resin R on the substrate. When the positions and roundness of the interference fringes exceed thresholds, it is determined that the mold M in a tilt state is being released from the cured resin R on the substrate, that is, imprint processing is abnormal. In this manner, even when the state of the substrate W greatly changes in a short period, the normality/abnormality of imprint processing can be determined at high accuracy by using interference fringes sensed by the image sensor 9b.

The timing to perform the determination (step S206) of the normality/abnormality of imprint processing will be explained with reference to FIGS. 12A to 12C. FIGS. 12A to 12C show images (interference fringes) sensed by the image sensor 9b with the lapse of time of the release process. In the release process, the mold M is deformed into a shape projecting toward the substrate in order to reduce a release force, which is a force for releasing the mold M from the cured resin R on the substrate, as described above. The mold M is released from the cured resin R on the substrate from the periphery of the mold M, and the peeling of the resin R from the substrate W can be prevented. In the release process, as in the impress process, a gap is generated between the mold M and the substrate W, and interference fringes as shown in FIGS. 12A to 12C are observed. Referring to FIGS. 12A to 12C, as the contact area between the mold M and the cured resin R on the substrate decreases, the size of interference fringes gradually decreases. At the timing when the size (diameter) of interference fringes becomes smaller than the predetermined size PS, it is determined whether the mold M in a tilt state is being released from the cured resin R on the substrate.

Since the release process is generally performed in a short time, it is difficult to specify the timing to determine whether the mold M in a tilt state is being released from the cured resin R on the substrate. However, by using (the size of) interference fringes sensed by the image sensor 9b, this embodiment can specify the timing to determine whether the mold M in a tilt state is being released from the cured resin R on the substrate.

In step S207, the normality/abnormality of imprint processing is determined based on an image sensed by the observation unit 9 (image sensor 9b) after the release process. As a reference for determining the normality/abnormality of imprint processing, the image of interference fringes sensed by the image sensor 9b is used. In the determination of the normality/abnormality of imprint processing in step S207, it is determined whether the pattern has normally been formed on the substrate W, for example, whether the resin R has peeled off the substrate W.

By releasing the mold M from the cured resin R on the substrate, the resin R having a pattern corresponding to the pattern P of the mold M is formed on the substrate W. FIG. 13A shows an image sensed by the image sensor 9b when the release step has been performed normally. If the pattern P of the mold M is a periodic line-and-space pattern, an image is obtained, in which the luminance is low at the portion of the resin R formed on the substrate W and high at the remaining portion, as shown in FIG. 13A. FIG. 13C shows an image sensed by the image sensor 9b when the release step has not been performed normally, for example, when the resin R has peeled off the substrate W and is attached to the mold M. In this case, an image is obtained, in which the luminance is high at a portion 71 where the peeling of the resin R has occurred, as shown in FIG. 13C.

Hence, whether the resin R has peeled off the substrate W is determined using a difference image representing the difference in luminance for each pixel at the same position between a reference image and an image sensed by the image sensor 9b after the release process. The reference image is an image sensed by the image sensor 9b after the release process when imprint processing is normal.

FIG. 13B shows a difference image obtained when the resin R has not peeled off the substrate W, as shown in FIG. 13A. The difference image shown in FIG. 13B is a difference image that does not greatly change and includes only low luminance values. This is because normal images are compared with each other. FIG. 13D shows a difference image obtained when the resin R has peeled off the substrate W, as shown in FIG. 13A. The difference image shown in FIG. 13D is a difference image that includes even a high luminance value because a large difference is generated between the image and the reference image at a portion 72 where the peeling of the resin R has occurred. When the difference image between the reference image and the image sensed by the image sensor 9b after the start of the release process includes a luminance value exceeding a predetermined luminance value, it can be determined that the resin R has peeled off the substrate W, that is, imprint processing is abnormal.

The determination of the normality/abnormality of imprint processing using such a difference image is effective even when determining the normality/abnormality of imprint processing on a substrate having an underlayer on which a pattern has already been formed. In this case, a reference image needs to be prepared for each underlayer.

The imprint apparatus 100 according to this embodiment can accurately determine the normality/abnormality of imprint processing by grasping the state of the substrate W at high accuracy in each process of imprint processing. The imprint apparatus 100 can suppress the influence of an abnormality of imprint processing and increase the productivity.

The imprint apparatus 100 according to this embodiment uses pieces of information from the alignment scope 5, the force sensor 16, and the observation unit 9 to specify the timing to determine the normality/abnormality of imprint processing. Not the timing when each process of imprint processing is switched, but the timing suitable for determining the normality/abnormality of imprint processing can be specified. In the impress process and the like, the normality/abnormality of imprint processing can be determined at different timings corresponding to states of the substrate W.

Although the normality/abnormality of imprint processing is determined in the supply process, impress process, and release process according to this embodiment, the present invention is not limited to this. For example, the normality/abnormality of imprint processing may be determined in at least two of the supply process, impress process, and release process, or at least either of the supply step and impress step. The normality/abnormality of imprint processing may be determined even at an interval between the impress step and the cure step or an interval between the cure step and the release step.

When it is determined that imprint processing is abnormal, an error process corresponding to the abnormality is performed. For example, when it is determined in step S203 that the particle G is attached to the substrate W, a process of removing the particle G can be performed, or a process of storing a position on the substrate at which the particle G is attached can be performed. When the particle G cannot be removed, imprint processing may be stopped, or the mold M may be inhibited from contacting the particle G (from forming a pattern).

This embodiment has been explained by exemplifying, as a resin curing method, a photo-curing method of curing a resin by irradiation with ultraviolet rays (light). However, the resin curing method is not limited to the photo-curing method, and may be a heat cycle method. In the heat cycle method, a thermoplastic resin is heated to a temperature equal to or higher than a glass transition temperature to enhance fluidity. In this state, the mold and the resin are brought into contact with each other, and the resin is cooled and cured. The mold is released from the cured resin on the substrate, thereby forming a pattern on the substrate.

A method of manufacturing a device (for example, a semiconductor device, magnetic storage medium, or liquid crystal display element) as an article will be explained. This manufacturing method includes a step of forming a pattern on a substrate (for example, a wafer, glass plate, or film substrate) using the imprint apparatus 100. This manufacturing method further includes a step of processing the substrate on which the pattern has been formed. The processing step can include a step of removing the residual film of the pattern. In addition, the method can include other known steps such as a step of etching the substrate using the pattern as a mask. The method of manufacturing an article according to this embodiment is advantageous over the related art in terms of at least one of the performance, quality, productivity, and production cost of articles.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2014-249197 filed Dec. 9, 2014, and 2015-194405 filed Sep. 30, 2015, which are hereby incorporated by reference herein in their entirety.

What is claimed is:

1. An imprint apparatus that performs imprint processing of forming a pattern of an imprint material on a substrate using a mold, the apparatus comprising:
   a processor;
   a memory;
   an image sensing unit configured to obtain an image of at least one of the mold and the substrate during the imprint processing; and
   a determination unit implemented by the processor and the memory and being configured to determine normality/abnormality of the imprint processing,
   wherein in the imprint processing, the imprint material is supplied onto the substrate in a first step of the imprint processing, and the mold and the imprint material on the substrate are brought into contact with each other in a second step of the imprint processing, and the determination unit is configured to determine, based on an image obtained by the image sensing unit after the mold and the imprint material are brought into contact with each other, normality/abnormality of the supply of the imprint material onto the substrate in the first step of the imprint processing based on a first reference image and normality/abnormality of the contact between the mold and the imprint material in the second step of the imprint processing based on a second reference image different from the first reference image.

2. The apparatus according to claim 1, wherein the imprint processing includes a third step of releasing the mold from the imprint material which is cured on the substrate, and the determination unit determines normality/abnormality of the releasing of the mold from the imprint material in the third step of the imprint processing based on a third reference image different from the first reference image and the second reference image and an image obtained by the image sensing unit.

3. The apparatus according to claim 2, wherein the image sensing unit obtains an image including interference fringes between light reflected by the mold and light reflected by the substrate, and the determination unit determines the normality/abnormality of the releasing of the mold from the imprint material in the third step of the imprint processing based on the interference fringes.

4. The apparatus according to claim 3, wherein the determination unit determines the normality/abnormality of the releasing of the mold from the imprint material in the third step of the imprint processing at a timing when a size of the interference fringes becomes smaller than a predetermined size.

5. The apparatus according to claim 1, wherein the image sensing unit obtains an image including interference fringes between light reflected by the mold and light reflected by the substrate, and the determination unit determines the normality/abnormality of the contact between the mold and the imprint material in the second step of the imprint processing based on the interference fringes.

6. The apparatus according to claim 5, further comprising a dispenser configured to supply droplets of the imprint material onto the substrate, wherein based on the interference fringes included in the image obtained by the image sensing unit, the determination unit determines whether droplets that should be supplied from the dispenser onto the substrate are omitted.

7. The apparatus according to claim 6, wherein the determination unit compares the interference fringes included in the image obtained by the image sensing unit with interference fringes included in the first reference image corresponding to a normal supply of imprint material onto a substrate, detects presence/absence of a bright/dark line generated in a moving direction of the substrate, and determines whether the droplets that should be supplied onto the substrate are omitted.

8. The apparatus according to claim 7, wherein the determination unit detects the presence/absence of the bright/dark line in the interference fringes, based on whether a boundary line of the interference fringes in the interference fringes included in the image obtained by the image sensing unit is approximate to a straight line parallel to the moving direction.

9. The apparatus according to claim 5, further comprising a force sensor configured to detect a force generated by contact between the mold and the imprint material on the substrate, wherein the determination unit determines (i) the normality/abnormality of the supply of the imprint material onto the substrate in the first step of the imprint processing, (ii) the normality/abnormality of the contact between the mold and the imprint material in the second step of the imprint processing, or both (i) and (ii) at a timing when the force detected by the force sensor exceeds a threshold.

10. The apparatus according to claim 5, further comprising a force sensor configured to detect a force generated by contact between the mold and the imprint material on the substrate, wherein the determination unit determines (i) the normality/abnormality of the supply of the imprint material onto the substrate in the first step of the imprint processing, (ii) the normality/abnormality of the contact between the mold and the imprint material in the second step of the imprint processing, or both (i) and (ii) at a timing when the force sensor detects the force.

11. The apparatus according to claim 5, further comprising an alignment detection unit configured to detect a mark formed on the mold and a mark formed on the substrate, and generate an alignment signal, wherein the determination unit determines the normality/abnormality of the contact between the mold and the imprint material in the second step of the imprint processing at a timing when the alignment signal generated by the alignment detection unit is stabilized in a preset period.

12. The apparatus according to claim 5, wherein the imprint processing includes a third step of releasing the mold from the imprint material which is cured on the substrate, and the determination unit determines the normality/abnormality of the releasing of the mold from the imprint material in the third step of the imprint processing at a timing when a size of the interference fringes included in the image obtained by the image sensing unit becomes larger than a predetermined size.

13. The apparatus according to claim 5, wherein the determination unit determines, based on the interference fringes, the normality/abnormality of the contact between the mold and the imprint material in the second step of the imprint processing according to a presence/absence of a foreign particle between the mold and the substrate.

14. The apparatus according to claim 5, wherein based on information about at least one of a position and roundness of the interference fringes included in the image obtained by the image sensing unit, the determination unit determines whether the mold in a tilt state contacts the imprint material on the substrate.

15. The apparatus according to claim 1, wherein the first reference image provides a reference for determining normality/abnormality of orifices provided in a supply unit configured to supply the imprint material on the substrate.

16. An imprint apparatus that performs imprint processing of forming a pattern of an imprint material on a substrate using a mold, the apparatus comprising:

a processor;

a memory;

an image sensing unit configured to obtain an image of at least one of the mold and the substrate during the imprint processing; and a determination unit implemented by the processor and the memory and being configured to determine normality/abnormality of the imprint processing, wherein in the imprint processing, the imprint material is supplied onto the substrate in a first step of the imprint processing, the mold and the imprint material on the substrate are brought into contact with each other in a second step of the imprint processing, and the mold is released from the imprint material which is cured on the substrate in a third step of the imprint processing, and the determination unit is configured to determine, based on an image obtained by the image sensing unit after the mold and the imprint material are brought into contact with each other, normality/abnormality of the supply of the imprint material onto the substrate in the first step of the imprint processing based on a first reference image, normality/abnormality of the contact between the mold and the imprint material in the second step of the imprint processing based on a second reference image different from the first reference image, and normality/abnormality of the releasing of the mold from the cured imprint material in the third step of the imprint processing based on a third reference image different from the first reference image and the second reference image.

17. An apparatus that cures an uncured material in a state of bringing a member and the uncured material on a substrate into contact with each other, the apparatus comprising:
a processor;
a memory;
an image sensing unit configured to obtain an image of at least one of the member and the substrate when the member and the uncured material are in contact with each other; and
a determination unit implemented by the processor and the memory and being configured to determine normality/abnormality of a step of supplying the uncured material onto the substrate based on an image obtained by the image sensing unit in a state in which the member and the uncured material supplied on the substrate contact each other.

18. The apparatus according to claim 17, wherein the determination unit determines normality/abnormality of the step of supplying the uncured material by comparing the image obtained by the image sensing unit in a state in which the member and the uncured material supplied on the substrate contact each other with an image obtained by the image sensing unit in a state in which the member and the uncured material supplied on the substrate contact each other when the uncured material is normally supplied onto the substrate.

19. The apparatus according to claim 17, wherein the determination unit determines normality/abnormality of the step of supplying the uncured material by determining whether the uncured material that should be supplied onto the substrate is omitted based on the image obtained by the image sensing unit in a state in which the member and the uncured material supplied on the substrate contact each other.

20. The apparatus according to claim 17, further comprising a dispenser configured to supply droplets of the uncured material onto the substrate,
wherein the determination unit determines whether there is an abnormality in a plurality of orifices provided in the dispenser based on the image obtained by the image sensing unit in a state in which the member and the uncured material supplied on the substrate contact each other.

21. The apparatus according to claim 17, wherein the determination unit determines normality/abnormality of a step of bringing the member and the uncured material supplied on the substrate into contact with each other based on the image obtained by the image sensing unit in a state in which the member and the uncured material supplied on the substrate contact each other.

22. The apparatus according to claim 21, wherein the determination unit determines normality/abnormality of the step of bringing the member and the uncured material supplied on the substrate into contact with each other based on interference fringes in an image obtained by the image sensing unit.

23. An apparatus that cures an uncured material in a state of bringing a member and the uncured material on a substrate into contact with each other, the apparatus comprising:
a processor;
a memory;
an image sensing unit configured to obtain an image of at least one of the member and the substrate when the member and the uncured material are in contact with each other; and
a determination unit implemented by the processor and the memory and being configured to determine normality/abnormality of a step of bringing the member and the uncured material on the substrate into contact with each other based on a plurality of reference images different from each other and an image obtained by the image sensing unit in a state in which the member and the uncured material supplied on the substrate contact each other.

* * * * *